United States Patent [19]

Tanaka

[11] Patent Number: 5,241,553
[45] Date of Patent: Aug. 31, 1993

[54] LASER DIODE FOR PRODUCING AN OPTICAL BEAM AT A VISIBLE WAVELENGTH

[75] Inventor: Hitoshi Tanaka, Kawasaki, Japan

[73] Assignee: Fujitsu Limited, Kawasaki, Japan

[21] Appl. No.: 817,446

[22] Filed: Jan. 6, 1992

[30] Foreign Application Priority Data

Jan. 10, 1991 [JP] Japan .................................. 3-012372

[51] Int. Cl.5 ................................................ H01S 3/19
[52] U.S. Cl. ....................................................... 372/45
[58] Field of Search ........................ 372/45, 44, 43, 46

[56] References Cited

U.S. PATENT DOCUMENTS 5,042,043  8/1991  Hatano et al. ........................ 372/45
5,177,757  1/1993  Tsugami ................................ 372/45

Primary Examiner—James W. Davie
Attorney, Agent, or Firm—Staas & Halsey

[57] ABSTRACT

A laser diode comprises a substrate of gallium arsenide, doped to a first conductivity type and extending in a longitudinal direction, a first clad layer provided on the substrate and doped to the first conductivity type, an active layer of a mixed crystal having a second band gap that is smaller than a band gap of the first clad layer and containing elements of boron, gallium, indium and a group V element, the active layer being provided on the first clad layer and extending in the longitudinal direction for producing a coherent optical beam in the longitudinal direction as a result of the stimulated emission with a visible wavelength, a second clad layer having a band gap larger than the band gap of the active layer and provided on the active layer with a second conductivity type opposite to the first conductivity type, a first electrode provided on the second clad layer for injecting carriers of a first type therein, a second electrode provided on a lower major surface of the substrate for injecting carriers of a second, opposite type therein; and reflection structures provided for establishing an optical resonance in the active layer.

9 Claims, 6 Drawing Sheets

LASER DIODE FOR PRODUCING AN OPTICAL BEAM AT A VISIBLE WAVELENGTH

BACKGROUND OF THE INVENTION

The present invention generally relates to semiconductor devices and more particularly to a laser diode that oscillates at a visible wavelength.

In the optical information processing apparatuses such as bar-code readers or optical disk drivers, a source producing a coherent optical beam is used. Particularly, there are applications wherein the optical source is required to produce the optical beam with the visible wavelength. Conventionally, He-Ne gas lasers have been used for this purpose. On the other hand, efforts have been made to replace the bulky He-Ne lasers by compact laser diodes that consume less power.

In using the laser diodes for the optical beam source of these various optical information processing apparatuses, there exists a problem in that the optical beam produced from the laser diodes generally has the wavelength of red close to the edge of the visible band. Thereby, there is a demand for shifting the oscillation wavelength of the laser diode to the shorter wavelength side as much as possible. It should be noted that the visual sensitivity of human eyes decreases to one-tenth when the wavelength is increased from 623 nm to 660 nm. When the optical beam having a shorter wavelength is produced, an improved recognition of optical information such as images would be achieved with reduced output power of the laser diode. Further, the use of the shorter wavelength beam would result in the increased recording density in the optical recording media such as optical disks.

The oscillation wavelength of the laser diode can be shifted shorter when a material having a larger band gap is used for the active layer of laser oscillation. Thus, the use of materials having the band structure that facilitates the direct transition of carriers and simultaneously has a large band gap is being studied. For example, there is a proposal to use an active layer having a composition of $(Al_xGa_{1-y})_{0.51}In_{0.49}P$ for the active layer. However, the materials that contain aluminum tend to cause a problem of unwanted oxidation of aluminum during the fabrication process of the device. When the oxide of aluminum is formed in the active device, the oxide acts as a defect that induces the recombination of carriers and the efficiency of laser oscillation is deteriorated inevitably. It should be noted that Al is easily oxidized when there is oxygen during the fabrication process. This problem becomes even more serious when the temperature of deposition is reduced.

The oxidation of Al in the AlGaInP mixed crystal is reduced when a high deposition temperature is used. However, the high deposition temperature facilitates the diffusion of impurities that are doped in the semiconductor layers of the laser diode, and the use of such Al-containing active layer may invite the problem of unwanted doping of the active layer.

Even in the active layers that are free from aluminum, the foregoing composition of $Ga_{0.51}In_{0.49}P$ causes a problem in that the Ga atoms and In atoms cause a spontaneous ordering to form an ordered structure wherein Ga atoms and In atoms are arranged alternately on the (100) plane. Thereby, a (111)-oriented GaP plane and a (111)-oriented InP plane appear alternately in the crystal structure of the GaInP mixed crystal.

Such a spontaneous ordering is believed to be a second-order phase transition and appears below the critical temperature of about 700° C. It is suspected that the large difference in the atomic radius between In and Ga is the cause of such a phase transition. More particularly, the energy of the crystal lattice as a whole would be reduced when the large In atoms and the small Ga atoms are arranged alternately rather than distributed at random.

It should be noted that, when the foregoing ordering occurs, the band gap of GaInP decreases by about 90 meV. Thus, when the foregoing composition of $Ga_{0.51}In_{0.49}P$ is used for the active layer of the laser diode, the oscillation wavelength becomes slightly smaller than the predicted oscillation wavelength. This effect is known as the "50 meV problem" (Gomyo et al. "Band gap energy anomaly in GaInP and spontaneous ordering" Ohyohbutsuri, vol.58, no.9, pp.1360–1367, 1989, in Japanese). Although this decrease of the band gap of 90 meV may seem insignificant, one should note that the oscillation wavelength of the laser diode is located close to the longer edge of the visible band of light, and the slight shift in the wavelength causes a significant effect as already noted.

FIG. 1 shows the relationship between the band gap and the composition of the active layer in the system of GaP-InP.

Referring to FIG. 1, the band gap that corresponds to the direct transition between both Γ-valleys of the valence band and the conduction band is represented by the solid line, while the band gap corresponding to the indirect transition between the X-valley of the conduction band and the Γ-valley of the valence band is represented by the one-dotted chain. Further, the band gap corresponding to the indirect transition between the L-valley of the conduction band and the Γ-valley of the valence band is represented by the broken line.

There, the solid line represents the principal transition for optical emission and it will be seen that the line is not exactly linear but convex in the downward direction at the intermediate composition. This is known as the bowing effect. The endmember GaP has a band gap (=2.81) much larger than the band gap (=1.35) of the endmember InP while the composition $Ga_{0.51}In_{0.49}$ is the only composition that establishes a lattice matching with a GaAs substrate. In other words, only the GaInP mixed crystal that has this composition can be grown on the GaAs substrate as an epitaxial layer. At this composition, the band gap for the transition between the Γ-valleys has the value of 1.9 eV. As a result of the bowing effect, this value of the band gap is smaller than the linear interpolation by about 0.2 eV. It is believed that the foregoing spontaneous ordering contributes, at least to a certain extent, to this decrease of the band gap energy.

FIG. 2 shows the relationship between the band gap energy Eg and the compositional parameter x for the material $(Al_xGa_{1-x})_{0.51}In_{0.49}P$. Similar to FIG. 1, the solid line designated as "EΓc-EΓv" represents the transition between the Γ-valleys of the conduction band and the valence band, the one-dotted chain designated as "EXc-EΓv" represents the transition between the X-valley of the conduction band and the Γ-valley of the valence band, and the broken line designated as "ELc-EΓv" represents the transition between the L-valley of the conduction band and the Γ-valley of the valence band.

As can be seen in FIG. 2, the value of the band gap can be increased by introducing Al into the GaInP active layer. However, Al causes the problem of unwanted oxidation as already noted.

SUMMARY OF THE INVENTION

Accordingly, it is a general object of the present invention to provide a novel and useful laser diode, wherein the foregoing problems are eliminated.

Another and more specific object of the present invention is to provide a laser diode having an active layer of a mixed crystal containing Ga and P, wherein the band gap of the mixed crystal is increased without adding Al.

Another object of the present invention is to provide a laser diode having an active layer of a mixed crystal containing Ga, In and P, wherein the problem of spontaneous ordering of Ga and In is eliminated.

Another object of the present invention is to provide a laser diode having an active layer of a mixed crystal containing B, Ga, In and P with a composition that establishes a lattice matching with a GaAs substrate, wherein the content of In is set such that there is formed no spontaneous ordering of Ga and In in the crystal lattice of the active layer. According to the present invention, one can increase the band gap of the active layer of the laser diode while eliminating the unwanted effect of the spontaneous ordering, and the laser diode can oscillate with the wavelength well in the visible band of light.

Other objects and further features of the present invention will become apparent from the following detailed description when read in conjunction with the attached drawings.

DETAILED DESCRIPTION

Next, the principle of the present invention will be described.

The inventors of the present invention have made a search for the elements that are stable with respect to oxygen and increases the band gap when incorporated into the mixed crystal of Ga, In and P. The following table lists the electronegativity of typical group III elements.

TABLE I

| B: | 2.0 |
|---|---|
| Al: | 1.5 |
| Ga: | 1.6 |
| In: | 1.7 |

Referring to TABLE I, it can be seen that B has the largest electronegativity while Al has the smallest electronegativity. As the electronegativity generally corresponds to the reactivity of the element with oxygen, the foregoing table indicates that Al is most reactive with oxygen while B is least reactive to oxygen. In fact, Al reacts with oxygen at the room temperature, while B remains stable up to the temperature of 700° C. or more. Further, the compound BP has a very large band gap that reaches as much as 6 eV for the direct transition between the Γ-valleys.

Figure 1:
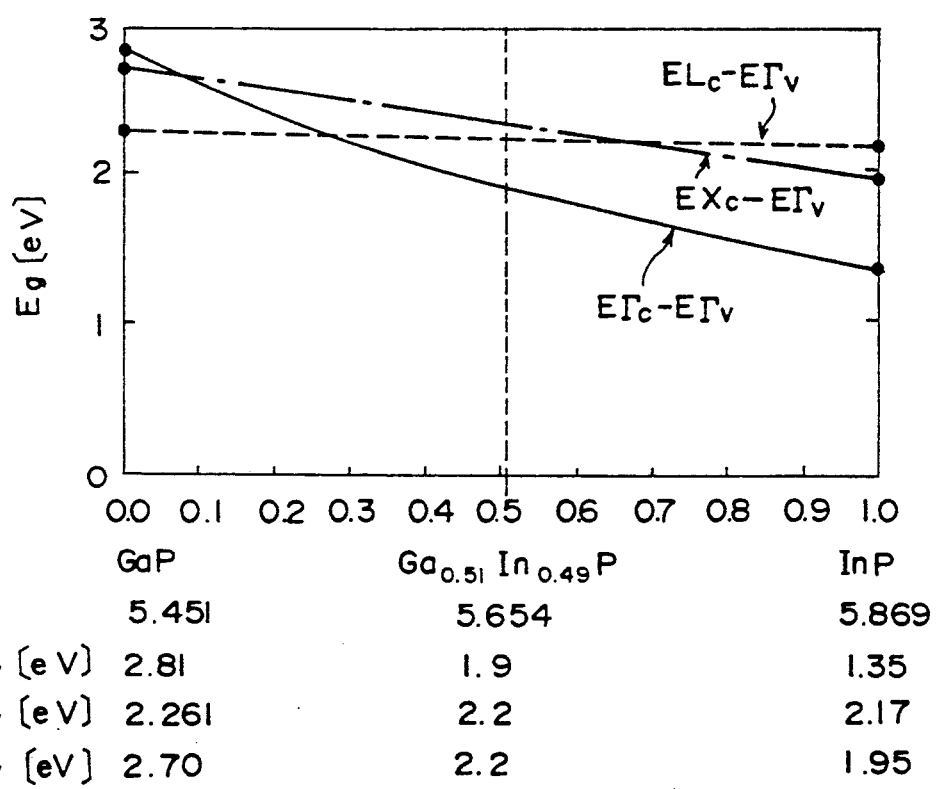
FIG. 1 is a diagram of the relationship between the band gap and the composition for a conventional GaInP mixed crystal that is used for the active layer of a laser diode.
Figure 2:
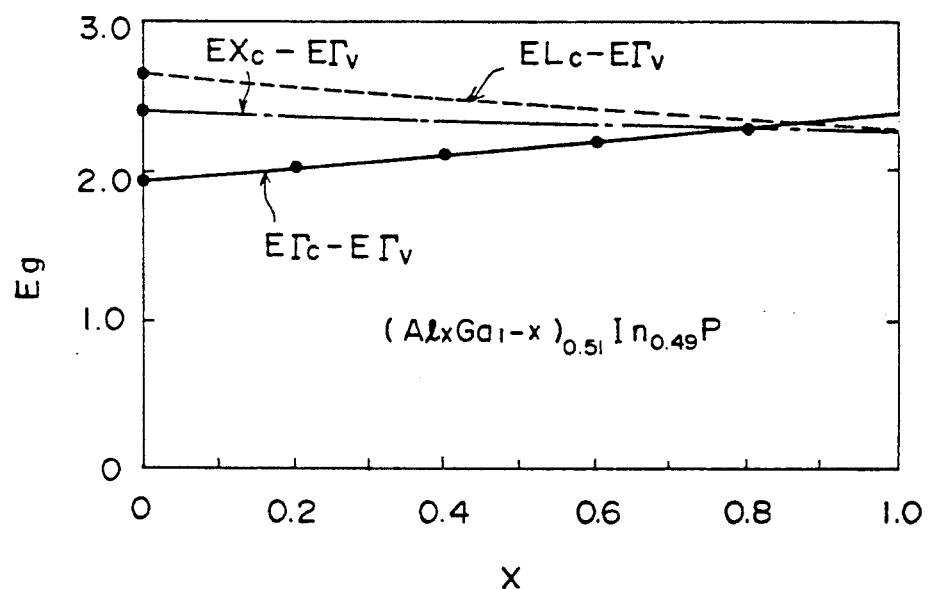
FIG. 2 is a diagram of the relationship between the band gap and the composition for a mixed crystal of the active layer that contains Al.
Figure 3:
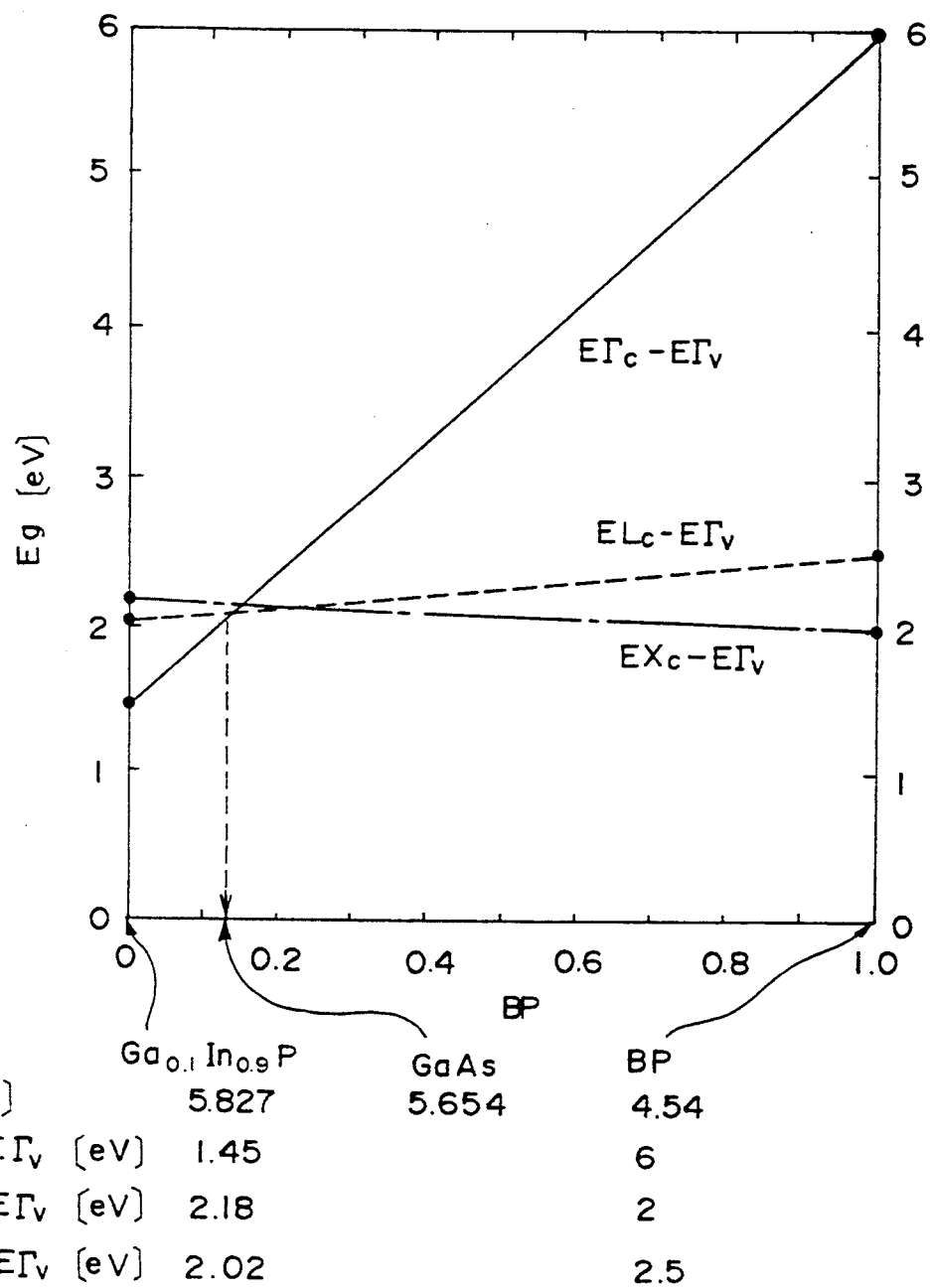
FIG. 3 is a diagram of the relationship between the band gap and the BP content for the mixed crystal used for the active layer of the laser diode of the present invention.

FIG. 3 shows the relationship between the band gap of the BGaInP mixed crystal as a function of the BP content therein. In this drawing, the compositional profile of band gap taken along the join $Ga_{0.1}In_{0.9}P$-BP is represented. The reason of the selection of the composition $Ga_{0.1}In_{0.9}P$ will be explained later.

As can be seen clearly from this drawing, the compound has the band gap of 6 eV at the endmember composition BP and the band gap decreases generally linearly with the decrease of the BP component. The endmember composition BP itself shows an indirect transition, as the band gap between the L-valley or X-valley of the conduction band and the Γ- valley of the valence band is smaller than the foregoing band gap of the direct transition. At the composition of $Ga_{0.1}In_{0.9}P$, the material has the band gap of 1.45 eV. Further, it will be noted that the band gap for the indirect transitions changes also linearly with the BP content in the GaInP mixed crystal.

Thus, it is predicted that the incorporation of BP into the GaInP active layer would cause the desirable increase of the band gap and hence the shift of the laser oscillation to the shorter wavelength side. As already noted previously, B has a desirable property of stability against oxidation. Thus, the active layer that contains B is substantially free from oxides that act as the recombination center and the problem of deterioration of the oscillation efficiency caused by the recombination of carriers in the active layer would be avoided.

In using B or the component BP in the GaInP active layer of laser diode, it is necessary to select the content of BP carefully such that the BGaInP mixed crystal forming the active layer establishes a lattice matching with the substrate underneath. It should be noted that BP has a significantly small lattice constant of 4.54 Å as compared with $Ga_{0.1}In_{0.9}P$ that has the lattice constant of 5.827 Å. Assuming the Vegard's law, the BP content in the mixed crystal that establishes the lattice matching with a GaAs substrate is calculated to be about 0.135. It should be noted that GaAs has the lattice constant of 5.654 Å. Thus, the composition of this material is represented as $(Ga_{0.1}In_{0.9})_{0.865}B_{0.135}P$ or $Ga_{0.0865}In_{0.7785}B_{0.135}P$.

Figure 4:
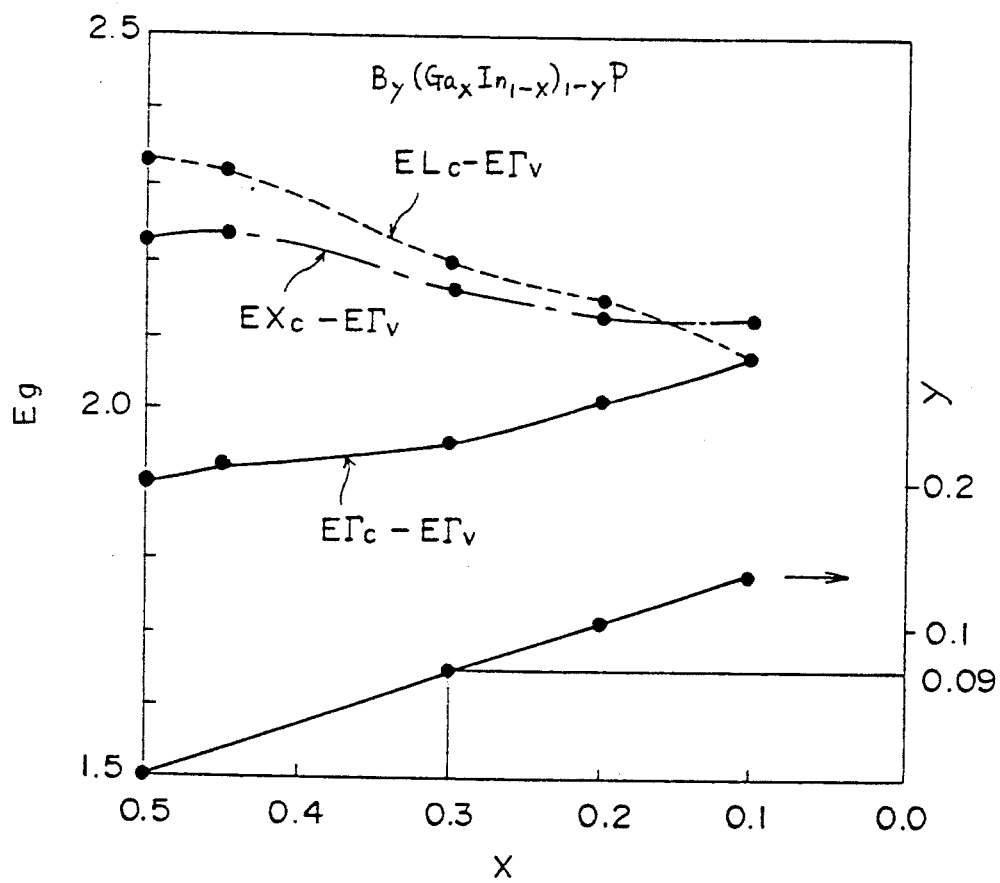
FIG. 4 is a diagram of the relationship between the band gap and the Ga content for the mixed crystal used for the active layer of the laser diode of the present invention.

FIG. 4 shows the relationship between the band gap of the BGaInP mixed crystal with increasing In and B content along the compositional path on which the lattice matching is maintained.

Referring to FIG. 4, the composition of the mixed crystal is represented as $B_y(Ga_xIn_{1-x})_{1-y}P$, and the horizontal axis represents the compositional parameter x while the vertical axis at the right represents the compositional parameter y. Thereby, the composition of the mixed crystal that establishes the lattice matching with GaAs is represented by the line at the bottom part of the drawing. On the other hand, the vertical axis at the left represents the band gap Eg. Generally, the line at the bottom, representing the composition of the acitve layer that matches with the GaAs substrate in terms of the lattice constant, is represented as $$y = -0.338x + 0.169$$

It will be noted that at the composition $x=0.5$, the compositional parameter y becomes zero and the composition $Ga_{0.5}In_{0.5}P$ cannot contain B as long as the lattice matching with GaAs is required. Further, the mixed crystal of this composition has the band gap of 1.9 eV that is not satisfactory for producing the visible radiation.

With increasing content of In and B, the band gap for the direct transition increases as represented by the continuous line designated as $E\Gamma c-E\Gamma v$. On the other hand, the band gap for the indirect transition represented by the broken lines designated as $ELc-E\Gamma v$ or $EXc-E\Gamma v$ decreases generally with increasing B and In content and crosses the curve representing the band gap for the direct transition at the foregoing composition of $B_{0.135}Ga_{0.086}In_{0.779}P$. At this composition, the band gap is calculated to be 2.07 eV. In the actual mixed crystal, however, the band gap for the direct transition is decreased slightly due to the bowing effect and the mixed crystal still maintains the property of the direct transition.

In the foregoing composition wherein the In content is significantly increased as compared with the conventional composition of $Ga_{0.51}In_{0.49}P$, one obtains another advantageous feature in that the problem of spontaneous ordering is substantially suppressed. As the spontaneous ordering is caused as a result of the interaction between Ga and In atoms, the effect of the ordering appears most conspicuously at the intermediate composition wherein Ga and In are contained with substantially the same ratio. In the present composition, there are an overwhelming number of In atoms in the mixed crystal as compared with Ga and the appearance of the alternate repetition of In and Ga atoms does not occur or is at least suppressed. Thereby, the problem of "50 meV problem," i.e. the unnecessary narrowing of the band gap is avoided.

Hereinafter, the structure of the laser diode according to an embodiment of the present invention will be described with reference to FIGS. 5 and 6.

Referring to the drawings, the laser diode is constructed on an n-type GaAs substrate 11 that extends in the longitudinal direction of the laser diode, and includes a buffer layer 12 of n-type GaAs grown on the substrate 11 with a thickness of 0.6 μm. On the buffer layer 12, a clad layer 13 of n-type AlGaInP with a composition of $(Al_{0.6}Ga_{0.4})_{0.5}In_{0.5}P$ is grown with a thickness of 1.2 μm. The clad layer 13 incorporates Se as the dopant with the impurity concentration of $3 \times 10^{17}$ cm$^{-3}$. On the clad layer 13, an active layer 14 of undoped BGaInP is provided with a thickness of 0.1 μm and the composition of $B_{0.135}Ga_{0.086}In_{0.779}P$ as the essential part of the present invention. As already noted, this composition achieves the lattice matching with the GaAs substrate 11 and realizes a large band gap exceeding 2 eV for the direct transition process. Further, as a result of the increased content of In in the material as compared with Ga, the problem of spontaneous ordering does not appear as already noted.

By selecting the composition of the clad layers 13 and 15 as such, one can secure the band gap that is larger at least by 150 meV than the band gap of the active layer 14 for the clad layers 13 and 15, and the effective heterojunction interface is formed at the upper and lower major surfaces of the active layer 14. Thereby, injected carriers are effectively confined in the active layer 14 and the efficiency of laser oscillation is maximized. Further, the optical confinement of photons in the active layer 14 is also achieved.

On the active layer 14, there is provided a clad layer 15 of p-type AlGaInP with a thickness of 1.2 μm. The clad layer 15 is doped by Zn with the impurity concentration of $1 \times 10^{18}$ cm$^{-3}$. On the clad layer 15, a current confinement layer 16 of n-type GaAs is provided with a thickness of 0.6 μm. The layer 16 is doped by Se with the impurity concentration of $3 \times 10^{17}$ cm$^{-3}$ and is provided with a central opening 16a that extends in the longitudinal direction of the laser diode and divides the layer 16 into a first part 16b and a second part 16c. Thereby, the upper major surface of the layer 15 is exposed at the opening 16a. Further, a p-type GaAs contact layer 17 is deposited on the layer 16 such that the layer 17 establishes a contact with the upper major surface of the layer 15 at the opening 16a. On the contact layer 17, a p-type electrode 18 of TiPtAu is provided to establish an ohmic contact therewith. Further, at a lower major surface of the substrate 11, an n-type electrode 19 of AuGeNi is deposited as usual in the laser diodes.

As usual, the body of the laser diode thus formed has reflection surfaces M1 and M2 respectively at the front end and the rear end, and a cavity for resonance is formed between both reflection surfaces. These surfaces may be formed simply as the cleaved surface. Alternatively, one may provide a reflection film in correspondence to the front and rear ends.

Another advantage of using the BGaInP mixed crystal for the active layer is that the mixed crystal is free from aluminum and hence can be grown at a relatively low temperature below 700° C., without sacrificing the quality of the crystal of the active layer. Thereby, a reliable control of the conductivity type can be achieved particularly for the active layer 14.

Hereinafter, the process for the fabrication of the laser diode of FIG. 5 will be described. The fabrication of the laser diode is achieved by a reduced pressure MOCVD process.

In the first step, the buffer layer 12 is grown on the substrate 11 according to the well established process. After the buffer layer 12 is formed, a hydrogen carrier gas is caused to flow over the surface of the buffer layer 12 with the flow rate of 10 l/min, while maintaining the temperature of the surface at 680° C.

While flowing the carrier gas as such, the clad layer 13 is grown at 650° C. by introducing a trimethyl gallium (TMG) gas, a trimethyl aluminum (TMA) gas, a trimethyl indium gas (TMIn) and a phosphine (PH$_3$) gas diluted to 10% concentration respectively as the source of Ga, Al, In and P with the flow rate of 1.0 SCCM, 8.5 SCCM, 40 SCCM and 200 SCCM. The TMG gas is formed by causing a bubbling in a TMG liquid source held at 0° C. by flowing hydrogen with a flow rate of 1.0 cc/min. The TMA gas is formed by causing a bubbling in a TMA liquid source held at 20° C. by flowing hydrogen with a flow rate of 8.5 cc/min. The TMIn gas is formed by causing a bubbling in a TMIn liquid source held at 20° C. by flowing a hydrogen gas with a flow rate of 40 cc/min. Further, the diluted phosphine gas is introduced with a flow rate of 200 cc/min. In order to dope the clad layer to the n-type, a hydrogen selenide (H$_2$Se) gas diluted to 1000 ppm is admixed with the flow rate of 50 cc/min.

The growth of the active layer 14 is achieved at 650° C. by introducing TMG, TMIn and phosphine with the flow rate of 1.0 SCCM, 8.5 SCCM and 400 SCCM respectively, and further diborane (B$_2$H$_6$) or triethyl boron ((C$_2$H$_5$)$_3$B). When diborane is used, the diborane gas is introduced with the flow rate of 500 SCCM. On the other hand, when trimethyl boron is used, the triethyl boron gas is introduced with the flow rate of 0.5 SCCM. As the active layer 14 is non-doped, no dopant gas is used.

The growth of the clad layer 15 is achieved similarly to that of the clad layer 13 except that a dopant gas of diluted dimethyl zinc ((CH$_3$)$_2$Zn) is admixed. More specifically, a dimethyl zinc gas diluted to 1000 ppm concentration is introduced with the flow rate of 1000 SCCM. The formation of the current confinement layer 16 and the contact layer 17 is made by the well established process and the description will be omitted.

In the above fabrication process, it should be noted that the deposition temperature of the active layer 14 and both clad layers 13 and 16 is set lower than 700° C. Thereby, the problem of the dopants in the clad layers diffusing into the active layer 14 is entirely eliminated. Although the quality of the crystal of the clad layers 13 and 15 may be deteriorated somewhat because of the reduced deposition temperature, this problem is insignificant as the recombination of the carriers occurs efficiently in the active layer 14 because of the excellent crystal quality of the layer 14.

Figure 5:
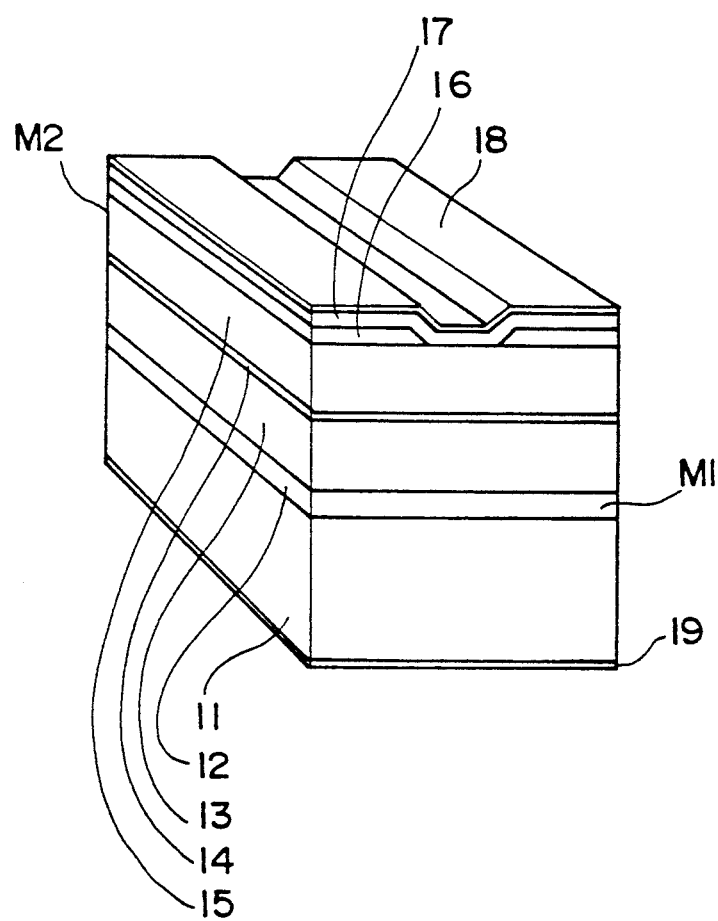
FIG. 5 is a perspective view of the structure of a laser diode according to an embodiment of the present invention.
Figure 6:
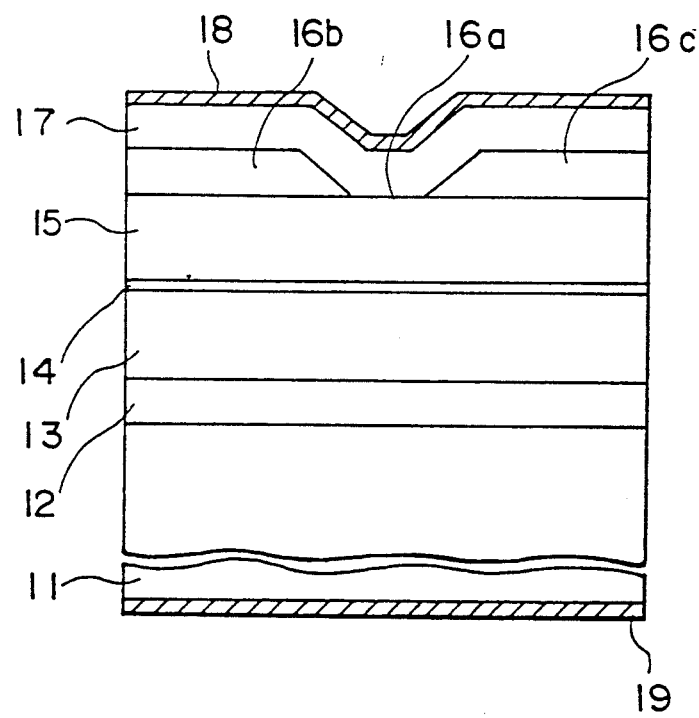
FIG. 6 is a cross sectional view of the vertical cross section of the laser diode of FIG. 5 in an enlarged scale.

In operation, the device of FIG. 5 is applied with a forward bias voltage such that a positive voltage is applied to the electrode 18 and a negative voltage is applied to the electrode 19 as usual. Thereby, the current flowing from the electrode 18 to the electrode 19 is confined by the p-n junction formed at the interface between the layers 16 and 17 and injected selectively into the clad layer 15 through the opening 16a. Thereby, the injection of the carriers occurs selectively to the active layer 14 in correspondence to the central opening 16a. As a result of the selective injection of the carriers into the active layer 14, the recombination and the associated stimulated emission occurs efficiently in the active layer 14.

It should be noted that other group V elements such as nitrogen can be used in place of P in the active layer.

Further, the present invention is not limited to the embodiments described heretofore, but various variations and modifications may be made without departing from the scope of the invention.

What is claimed is:

1. A laser diode for producing a coherent optical beam in the visible wavelength, comprising:

a substrate of gallium arsenide, said substrate having upper and lower major surfaces and being doped to a first conductivity type, said substrate extending in a longitudinal direction between a front face and a rear face;

a first clad layer having a first band gap and provided on said upper major surface of said substrate and doped to said first conductivity type, said first clad layer having upper and lower major surfaces and extending in the longitudinal direction between a front face thereof corresponding to said front face of said substrate and a rear face thereof corresponding to said rear face of said substrate;

an active layer of a mixed crystal having a second band gap that is smaller than said first band gap, said mixed crystal containing elements of boron, gallium, indium and a group V element, said active layer being provided on said upper major surface of said first clad layer and having upper and lower major surfaces, said active layer extending in the longitudinal direction between a front face thereof corresponding to said front face of said substrate and a rear face thereof corresponding to said rear face of said substrate and producing said coherent optical beam in said longitudinal direction as a result of stimulated emission;

a second clad layer having a third band gap larger than said second band gap, said second clad layer being provided on said upper major surface of said active layer and doped to a second, opposite conductivity type, said second clad layer having upper and lower major surfaces and extending in said longitudinal direction between a front face thereof corresponding to said front face of said substrate and a rear face thereof corresponding to said rear face of said substrate;

first electrode means provided on said upper major surface of said second clad layer for injecting carriers of a first type therein;

second electrode means provided on said lower major surface of said substrate for injecting carriers of a second, opposite type therein; and reflection means for establishing an optical resonance in said active layer.

2. A laser diode as claimed in claim 1 in which said mixed crystal forming said active layer has a composition set such that the mixed crystal has a lattice constant substantially identical with a lattice constant of gallium arsenide.

3. A laser diode as claimed in claim 2 in which said mixed crystal forming said active layer contains phosphorus as the group V element and has a composition set such that the mixed crystal has said second band gap that is larger than a band gap of gallium arsenide.

4. A laser diode as claimed in claim 3 in which said mixed crystal forming the said active layer contains indium with an amount substantially exceeding an amount of gallium such that the spontaneous ordering of gallium and indium does not occur in the mixed crystal.

5. A laser diode as claimed in claim 3 in which said second band gap corresponds to the direct transition and has a value of about 2.07 eV.

6. A laser diode as claimed in claim 5 in which said mixed crystal has a composition of $B_{0.135}Ga_{0.086}In_{0.779}P$.

7. A laser diode as claimed in claim 3 in which said mixed crystal has a composition represented as $B_y(Ga_xIn_{1-x})_{1-y}P$ with a relationship between the parameter x and the parameter y as $y = -0.338x + 0.169$.

8. A laser diode as claimed in claim 7 in which said first and second clad layers comprising a mixed crystal of AlGaInP with a composition of $(Al_zGa_{1-z})_{0.5}In_{0.5}P$.

9. A laser diode as claimed in claim 5 in which said group V element is selected from phosphorus and nitrogen.

* * * * *